United States Patent [19]

Te Velde et al.

[11] E Re. 28,703

[45] Reissued Feb. 3, 1976

[54] METHOD OF MANUFACTURING A SEMICONDUCTOR DEVICE

[75] Inventors: Ties Siebolt te Velde; Hein Koelmans, both of Eindhoven, Netherlands

[73] Assignee: U.S. Philips Corporation, New York, N.Y.

[22] Filed: May 4, 1970

[21] Appl. No.: 34,484

Related U.S. Patent Documents

Reissue of:

[64] Patent No.: 3,481,030
Issued: Dec. 2, 1969
Appl. No.: 630,026
Filed: Apr. 11, 1967

[30] Foreign Application Priority Data

Apr. 14, 1966 Netherlands ..... 6604963
Dec. 2, 1969 Netherlands ..... 3481030

[52] U.S. Cl. ..... 29/571; 29/578; 29/576 B; 29/590

[51] Int. Cl.² ..... B01J 17/00

[58] Field of Search ..... 29/571, 578, 576 B, 590

[56] References Cited

UNITED STATES PATENTS

| | | | |
|---|---|---|---|
| 2,563,503 | 8/1951 | Wallace | 357/9 |
| 2,735,948 | 2/1956 | Sziklai | 29/577 X |
| 2,787,564 | 4/1957 | Shockley | 148/1.5 |
| 2,981,877 | 4/1961 | Noyce | 317/235 |
| 3,298,863 | 1/1967 | McCusken | 29/584 |
| 3,311,756 | 3/1967 | Nagata et al. | 307/304 |
| 3,472,712 | 10/1969 | Bower | 29/571 X |

*Primary Examiner*—W. Tupman
*Attorney, Agent, or Firm*—Frank R. Trifari; Jack Oisher

[57] ABSTRACT

A method of making a field effect transistor in which a gate electrode is provided on a semiconductor layer and then the surface subjected to electron or ion bombardment to form the source and drain electrodes on opposite sides of the gate, acting as a mask, and spaced apart by the width of the gate.

12 Claims, 5 Drawing Figures

Figure 1:
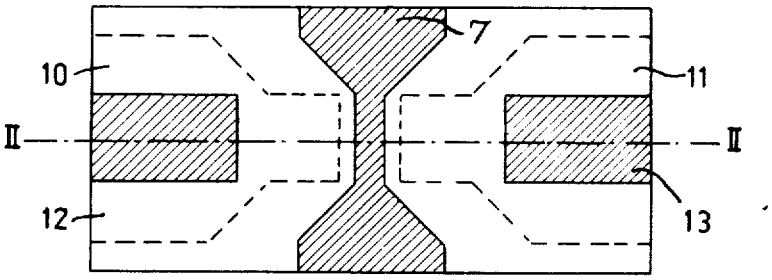
Figure 2:
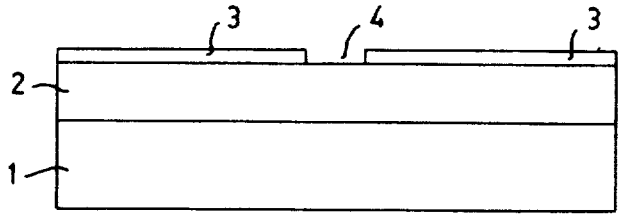
Figure 3:
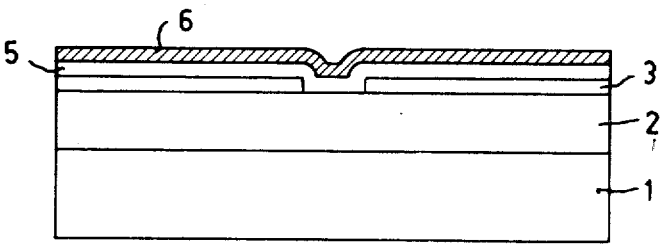
Figure 4:
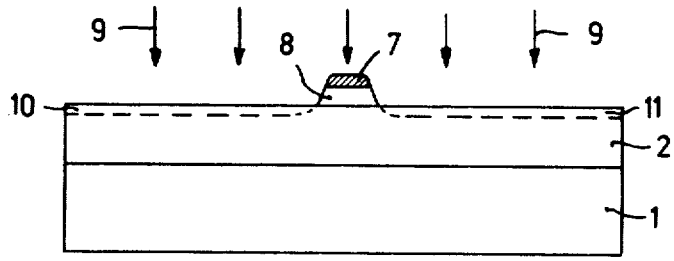
Figure 5:
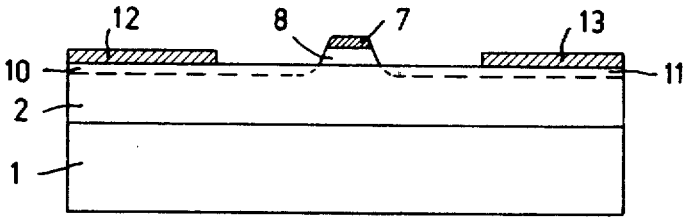

INVENTORS
TIES S.TE VELDE
HEIN KOELMANS
BY
Frank R. Trifari
AGENT

METHOD OF MANUFACTURING A SEMICONDUCTOR DEVICE

Matter enclosed in heavy brackets [ ] appears in the original patent but forms no part of this reissue specification; matter printed in italics indicates the additions made by reissue.

The invention relates to a method of manufacturing a semiconductor device comprising at least one field-effect transistor which is arranged in a semiconductor layer provided on a substrate which layer preferably consists of a sulphide or a selenide of cadmium or zinc or of a mixed crystal of sulphides or selenides of cadmium or zinc, which transistor is provided with at least one source electrode and one drain electrode and with at least one gate electrode which is connected to a part of the semiconductor layer located between the source and the drain electrode.

The invention furthermore relates to a semiconductor device which is manufactured by using the method according to the invention.

Semiconductor devices comprising at least one field effect transistor of the type described above are known in various constructions in which the source and drain electrode and the gate electrodes may be arranged both on the same side and on opposite sides of the semiconductor layer. In these devices the source and drain electrode in the form of conductive strips are provided at a very short distance beside one another and the gate electrode, preferably separated from the semiconductor by a thin insulating layer, is provided on the intermediate part of the semiconductor layer. A gate electrode is to be understood to include the said insulating layer if that layer is present. It has been found in practice that providing [cource] *source* and drain electrodes at very short distances beside one another, for example, by a selective vapour-deposition through a mask, often presents difficulties. This holds in particular as far as the location of source and drain electrodes relative to the gate electrode is concerned in which, for example, the gate electrode may not overlap the source and drain electrodes while the source and drain electrodes must nevertheless adjoin the gate electrode as closely as possible.

It is the object of this invention to provide a method in which in a simple manner source and drain electrodes can be provided at a very small mutual distance on a field-effect transistor of the type mentioned to the preamble.

The invention is based inter alia on the recognition of the fact that by using the gate electrode or a part thereof as a mask in [anion] *an ion* or electron bombardment, readily conducting mutually separated surface layers which serve as source and drain electrodes can be formed in a semiconductor body in which in a very simple manner the desired location of the gate electrode and the source and drain electrodes relative to one another is obtained while avoiding overlapping and in which said layers, after providing a contact, show very favourable electric properties, for example, to form ohmic connections.

Therefore, according to the [inventon] *invention*, a method of the type mentioned in the preamble is characterized in that on the surface of the semiconductor remote from the substrate, first, the gate electrodes are provided at least partly, after which an ion or electron bombardment is carried out on the semoconductor surface as a result of which the uncovered regions of the semiconductor surface located beyond the gate electrodes become more strongly conductive, contacts being then provided on these more strongly conductive regions which serve as source and drain electrodes. The regions of the semiconductor surface located below the gate electrode(s) which is (are) wholly or partly provided are not exposed to the ion or electron bombardment so that readily conducting contact layers can be realized at the surface at very small mutual distances, which layers can then be provided with contacts, if desired, at places which are located further away from one another. As a result of this the desired location of the gate electrode and the source and drain electrodes relative to one another is obtained in a simple manner while overlapping is avoided. The additional advantage is obtained that an ohmic contact can be formed on these contact layers with metals, for example, gold and platinum, which are particularly suitable as electrode materials as a result of their low resistivity and corrosion resistance, but which do not form ohmic contact with the said semiconductor materials as such.

The gate electrodes may be provided in various manners. A gate electrode as a whole may be provided prior to the ion or electron bombardment. Alternatively, for example, when a gate electrode is connected to the semiconductor surface through an insulating layer, said insulating layer may first be provided separately, if desired, while the gate contact is provided on the insulating layer after the ion or electron bombardment.

According to an important preferred embodiment the gate electrodes are provided by using a photoresist method. In this manner the proportions of the gate electrode in the direction of the source and drain electrode and consequently also the mutual distance between the source and drain electrode may be made very small which is desirable for obtaining favourable transistor properties.

As a contact material for the source and drain electrodes many metals or alloys may be used. Advantageously, however, contacts which consist of gold, platinum or a nickel-chromium alloy are provided on the more strongly conductive regions, inter alia with a view to the resistance against chemical influences and in connection with the favourable conductivity properties.

According to an important preferred embodiment of the method according to the invention a semiconductor layer is used which consists of cadmium sulphide.

The ion bombardment is preferably carried out in the form of a gas discharge between the semiconductor layer and a further electrode, which gas discharge may take place, for example, in the same vacuum equipment in which subsequently contacts are provided by vapour-deposition on the formed more strongly conductive regions.

The invention further relates to a semiconductor device manufactured by using the method according to the invention.

In order that the invention may readily be carried into effect one embodiment thereof will now be described in greater detail, by way of example, with reference to the accompanying drawing, in which FIG. 1 is a plan view of a field-effect transistor manufactured by using the method according to the invention, FIGS. 2 to 5 are diagrammatic cross-sectional views taken on the line II—II of the field-effect transistor shown in FIG. 1 in successive stages of manufacture.

For clearness' sake the figures are not drawn to scale. In the following example the manufacture will be described of a field-effect transistor of the so-called TFT (thin film) type.

Starting material is a glass substrate 1 (see FIGS. 1 and 2) on which a layer 2 (see FIG. 2) of high ohmic n-type cadmium [sulphite] *sulphide* is vapour-deposited in a thickness of 0.1 micron. In the manner commonly used in semiconductor technology a mask 3 of a hardened photoresist is provided on said cadmium sulphide layer 2, said mask comprising a gap 4. A photoresist is to be understood to include the photochemical substances normally used in photoresist methods. There is to be distinguished between a negative photoresist—which by a photochemical process is selectively hardened and becomes insoluble in the associated developer at the exposed places and remains soluble at the unexposed places—and a positive photoresist—which by a photochemical process becomes selectively soluble in the associated developer at the exposed places and remains insoluble at the unexposed places. In this example a positive photoresist is used, for example, "Kalle Kopierlack PIRE 2327/50," obtainable from Kalle A.G., Weisbaden, Germany.

An insulating layer 5 (see FIG. 3) consisting of silicon oxide, 500 A, thick, is then vapour-deposited on the cadmium sulphide layer 2 and the mask 3, after which finally an aluminum layer 6, 600 A. thick, is vapour-deposited on said layer. By spraying with acetone the photoresist mask 3 with the parts of the layers 5 and 6 provided thereon are then removed, a gap-like gate electrode 7, 8 (see FIG. 4) being formed which is connected to the semiconductor layer 2 by an insulating layer 8.

Subsequently an ion bombardment is applied to the surface of the cadmium sulphide in the direction of the arrows in the form of a gas discharge in a vacuum chamber. The layer is placed on a metallic support which is situated at a distance of about 10 cm. from a metallic electrode with a surface of about 100 cm.$^2$. The chamber is then evacuated and the electrode is biased positively at about 1 kv. with respect to the support. Then a gas as for instance argon, oxygen or nitrogen is admitted by means of a needle valve, so that a gas discharge is established in which the positive gas ions hit the cadmium sulphide layer. The pressure is regulated so that a discharge current of about 50 mA. is maintained; this pressure may be of the order of 0.2 mm. The ion bombardment is carried out for about 4 minutes. This ion bombardment may be substituted by an electron bombardment for instance by inversion of the polarities of the said support and the said electrode. Because of the difference in mass between ions and electrons, in order to obtain the same effect an electron bombardment should be carried out for a time or at a current which are 5 to 10 times superior to those required for an ion bombardment. The nature of the employed gases and the above mentioned parameters are not critical. The gate electrode (7, 8) serves as a mask. As a result of this bombardment strongly conductive surfaces 10 and 11 are formed in the uncovered regions of the cadmium sulphide. These readily conducting layers 10 and 11 may then be provided at suitable places (see FIG. 5) with the contacts 12 and 13 by vapour depositing, if required through a mask, a gold layer (12, 13), 500 A. thick, which forms an ohmic contact with the strongly conducting contact layers 10 and 11.

In this manner a field-effect transistor is obtained having surface layers 10 and 11 serving as source and drain electrodes.

It will be clear that the method is not restricted to the example described but that many variations are possible to those skilled in the art without departing from the scope of this invention. For example, the gate electrode may be provided, besides by a photoresist method, in a different manner also, for example, by vapour-depositing selectively through a mask. Alternatively, the gate electrode need not be provided entirely before the ion or electron bombardment is carried out. For example, in the above example it is sufficient for masking against the gas discharge to provide an oxide layer 8 after which the contact 7 is provided at a later instant. In addition, metals other than gold, for example, platinum or a nickel-chromium alloy, may also be used as source and drain contacts while the semiconductor layer also may consist of other materials than the cadmium sulphide used in this example.

Finally it is to be noted that although the invention is of particular importance for providing ohmic source and drain contacts, the invention may also be applied to semiconductors in which ion bombardment produces inversion of the conductivity type also in addition to an increase of the conductivity. This may be of importance, for example, for the manufacture of [most-type] *MOST-type* transistors in which (see, for example, FIG. 4) the surface layers 10 and 11 are source and drain electrodes of a conductivity type opposite to that of the remaining part of the layer 2.

What is claimed is:

1. A method of manufacturing a semiconductor device comprising at least one field-effect transistor having source, drain and gate electrodes coupled to a semiconductor layer, [comprising providing on a surface of a semiconductor layer,] comprising providing on a surface of a semiconductor layer at least part of a gate electrode in a thickness capable of blocking impinging ions or electrons leaving exposed semiconductor surface portions on opposite sides of the gate, subjecting the said gate and the said exposed surfaces of the semiconductor layer on opposite sides of the provided gate electrode to ion or electron bombardment to modify the conductivity of the exposed semiconductor surface portions while the said gate blocks the underlying surface portions from receiving said bombardment, and providing on the said surfaces of modified conductivity and spaced from the gate electrode ohmic contacts to form source and drain contacts, the surfaces of modified conductivity forming source and drain electrodes spaced apart by the width of the gate electrode in the completed device.

2. A method as claimed in claim 1, characterized in that the gate electrode is provided by using a photoresist method.

3. A method of manufacturing a semiconductor device comprising at least one field-effect transistor having source, drain and gate electrodes coupled to a semiconductor layer, comprising providing on a substrate a layer of semiconductive material, providing on a surface of the semiconductor layer remote from the substrate an insulating layer and on the insulating layer at least part of a gate electrode in a thickness capable of blocking impinging ions or electrons leaving exposed semiconductor surface portions on opposite sides of the gate, subjecting the said gate and the said exposed surfaces of the semiconductor layer on opposite sides of the provided gate electrode to ion or electron bombardment, until the said exposed surfaces exhibit increased conductivity while the said gate blocks the underlying surface portions from receiving said bombardment, and providing on the said surfaces of increased conductivity and spaced from the gate electrode ohmic contacts of a material selected from the group consisting of gold, platinum and nickel-chromium alloy to form source and drain contacts, the surfaces of increased conductivity forming source and drain electrodes spaced apart by the width of the gate electrode in the completed device.

4. A method as claimed in claim 3, characterized in that the semiconductor layer is cadmium sulphide.

5. A method as claimed in claim 3, characterized in that an ion bombardment is used in the form of a gas discharge between the semiconductor layer and a further electrode.

*6. A method of manufacturing an insulated gate field effect transistor comprising forming on a semiconductor body surface an insulating layer and on the latter a gate electrode layer, and using the insulated gate electrode structure as a bombardment mask ion bombarding the semiconductor body surface to form therein adjacent the semiconductor surface source and drain electrode region portions spaced apart by the bombardment-masked surface region below the insulated gate electrode structure.*

*7. A method as claimed in claim 6 wherein at the surface the semiconductor body is of one conductivity type and ion bombardment is effected to form source and drain electrode region portions of the opposite conductivity type.*

*8. A method as claimed in claim 7, wherein the transistor formed is a MOST-type transistor.*

*9. A method of fabricating an insulated gate field effect device comprising the steps of forming an insulated gate electrode member on a portion of the surface of a semiconductor body, and causing ions productive of conductivity type inversion to impinge on said surface, whereby more strongly conductive regions of like conductivity types are established in the semiconductor body adjacent and spaced apart by a less-strongly conductive body region of the opposite conductivity type under the insulated gate electrode member.*

*10. A method of making a field-effect transistor comprising providing an insulated gate electrode on a body comprising a semiconductor leaving exposed surface regions of the body on opposite sides of the gate electrode, subjecting the body to electron or ion bombardment incapable of penetrating the gate electrode which thereby masks the underlying semiconductor surface but capable of reaching and impinging on to modify the conductivity of the semiconductor surface regions on opposite sides of the gate electrode to form thereat in the semiconductor source and drain electrodes spaced precisely apart by the width of the gate electrode and not overlapped by the bombardment masking gate.*

*11. A method as set forth in claim 10 wherein the gate electrode is formed using a photoresist method.*

*12. In the method of making an insulated-gate field-effect transistor having a body comprising a semiconductor having adjacent a surface spaced source and drain electrodes separated by a region with an insulated gate electrode on the semiconductor surface over the said region and source and drain contacts to the source and drain electrodes respectively, the source and drain contacts being spaced from the said region, the improvement comprising forming an insulated-gate electrode on the semiconductor surface portion overlying the said region and substantially coextensive with the said region, and thereafter causing ions to impinge on the surface of the semiconductor containing the insulated gate electrode to modify the conductivity of the semiconductor surface regions on opposite sides of the insulated gate to establish source and drainn electrodes directly adjacent the said region under the insulated gate electrode, said insulated gate electrode having a thickness capable of blocking the impinging ions thereby masking the said underlying region against the effect of the impinging ions.*

* * * * *

UNITED STATES PATENT AND TRADEMARK OFFICE

CERTIFICATE OF CORRECTION

PATENT NO. : RE 28,703

DATED : February 3, 1976

INVENTOR(S) : TIES SIEBOLT TE VELDE ET AL

It is certified that error appears in the above-identified patent and that said Letters Patent are hereby corrected as shown below:

On the front page of the patent, in paragraph 30, delete -- December 2, 1969 Netherlands ..... 3481030--.

Signed and Sealed this

Twenty-sixth Day of October 1976

[SEAL]

*Attest:*

RUTH C. MASON
*Attesting Officer*

C. MARSHALL DANN
*Commissioner of Patents and Trademarks*